(12) United States Patent
Hsu et al.

(10) Patent No.: US 8,283,222 B2
(45) Date of Patent: Oct. 9, 2012

(54) METHOD TO FORM A SEMICONDUCTOR DEVICE HAVING GATE DIELECTRIC LAYERS OF VARYING THICKNESS

(75) Inventors: Kuang-Yuan Hsu, Fongyuan (TW); Da-Yuan Lee, Jhubei (TW); Wei-Yang Lee, Taipei (TW); Hun-Jan Tao, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/215,658

(22) Filed: Aug. 23, 2011

(65) Prior Publication Data

US 2011/0306196 A1    Dec. 15, 2011

Related U.S. Application Data

(63) Continuation of application No. 12/649,555, filed on Dec. 30, 2009, now Pat. No. 8,008,143.

(51) Int. Cl.
*H01L 21/338* (2006.01)
(52) U.S. Cl. ........................................ 438/183; 438/275
(58) Field of Classification Search ........................ None
See application file for complete search history.

(56) References Cited

U.S. PATENT DOCUMENTS

| | | | |
|---|---|---|---|
| 5,960,289 A | 9/1999 | Tsui et al. | |
| 6,110,842 A | 8/2000 | Okuno et al. | |
| 6,258,673 B1 | 7/2001 | Houlihan et al. | |
| 6,602,751 B2* | 8/2003 | Oohashi | 438/275 |
| 6,953,727 B2 | 10/2005 | Hori | |
| 7,118,974 B2 | 10/2006 | Chen et al. | |
| 7,274,046 B2 | 9/2007 | Adam et al. | |
| 7,611,979 B2* | 11/2009 | Callegari et al. | 438/588 |
| 7,902,610 B2 | 3/2011 | Tai et al. | |
| 8,008,143 B2* | 8/2011 | Hsu et al. | 438/183 |
| 2002/0004270 A1 | 1/2002 | Moriwake et al. | |
| 2004/0140518 A1 | 7/2004 | Lee | |
| 2005/0014352 A1 | 1/2005 | Torii et al. | |
| 2005/0272191 A1* | 12/2005 | Shah et al. | 438/197 |
| 2010/0148274 A1 | 6/2010 | Tai et al. | |

* cited by examiner

*Primary Examiner* — Alonzo Chambliss
(74) *Attorney, Agent, or Firm* — Haynes and Boone, LLP

(57) ABSTRACT

A method for fabricating an integrated circuit device is disclosed which includes providing a substrate having first, second, and third regions; and forming first, second, and third gate structures in the first, second, and third regions, respectively. The first, second, and third gate structures include a gate dielectric layer, the gate dielectric layer being a first thickness in the first gate structure, a second thickness in the second gate structure, and a third thickness in the third gate structure. Forming the gate dielectric layer of the first, second, and third thicknesses can include forming an etching barrier layer over the gate dielectric layer in at least one of the first, second, or third regions while forming the first, second, and third gate structures, and/or prior to forming the gate dielectric layer in at least one of the first, second, or third regions, performing an implantation process on the at least one region.

20 Claims, 12 Drawing Sheets

METHOD TO FORM A SEMICONDUCTOR DEVICE HAVING GATE DIELECTRIC LAYERS OF VARYING THICKNESS

CROSS-REFERENCE TO RELATED APPLICATION

This application is a continuation of U.S. patent application Ser. No. 12/649,555, filed Dec. 30, 2009, issued as U.S. Pat. No. 8,008,143, the entire disclosure of which is incorporated herein by reference.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

SUMMARY

The present disclosure provides for many different embodiments. An exemplary method for fabricating an integrated circuit device may comprise providing a substrate with a first region, a second region, and a third region; forming a first gate structure in the first region, wherein the first gate structure includes a first gate dielectric layer having a first thickness, a barrier layer, and a dummy gate layer; forming a second gate structure in the second region, wherein the second gate structure includes a dummy gate dielectric layer and the dummy gate layer; and forming a third gate structure in the third region, wherein the third gate structure includes the dummy gate dielectric layer and the dummy gate layer.

The method can further comprise removing the dummy gate layer from the first, second, and third gate structures, thereby forming openings in the first, second, and third gate structures; performing an implantation process in the second region; and removing the dummy gate dielectric layer from the openings of the second and third gate structures. Then, an interfacial dielectric layer can be formed to partially fill in the openings of the second and third gate structures, wherein the interfacial dielectric layer of the second gate structure has a second thickness and the interfacial dielectric layer of the third gate structure has a third thickness. A gate can be formed in the openings of the first, second, and third gate structures.

Another exemplary method can include providing a substrate having a first region, a second region, and a third region; and forming a first gate structure in the first region, a second gate structure in the second region, and a third gate structure in the third region, wherein the first, second, and third gate structures include a gate dielectric layer, the gate dielectric layer being a first thickness in the first gate structure, a second thickness in the second gate structure, and a third thickness in the third gate structure. Forming the gate dielectric layer of the first, second, and third thicknesses can include forming an etching barrier layer over the gate dielectric layer in at least one of the first, second, or third regions while forming the first, second, and third gate structures, and/or prior to forming the gate dielectric layer in at least one of the first, second, or third regions, performing an implantation process on the at least one region.

Yet another exemplary method can include providing a substrate with a first region, a second region, and a third region; forming a first gate dielectric layer having a first thickness in the first region; forming a barrier layer over the first gate dielectric layer; forming a dummy gate dielectric layer in the second and third regions; and forming a dummy gate layer over the barrier layer and the dummy gate dielectric layer. The method can further include performing a gate patterning process to form gate structures in the first, second, and third regions; removing the dummy gate layer from the gate structures in the first, second, and third regions, thereby forming an opening in the gate structures; performing an implantation process in the second region; removing the dummy gate dielectric layer from the gate structures in the second and third regions; and forming a second gate dielectric layer to partially fill in the openings of the gate structures in the second and third regions, wherein the second gate dielectric layer in the second region exhibits a second thickness and the second gate dielectric layer in the third region exhibits a third thickness.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
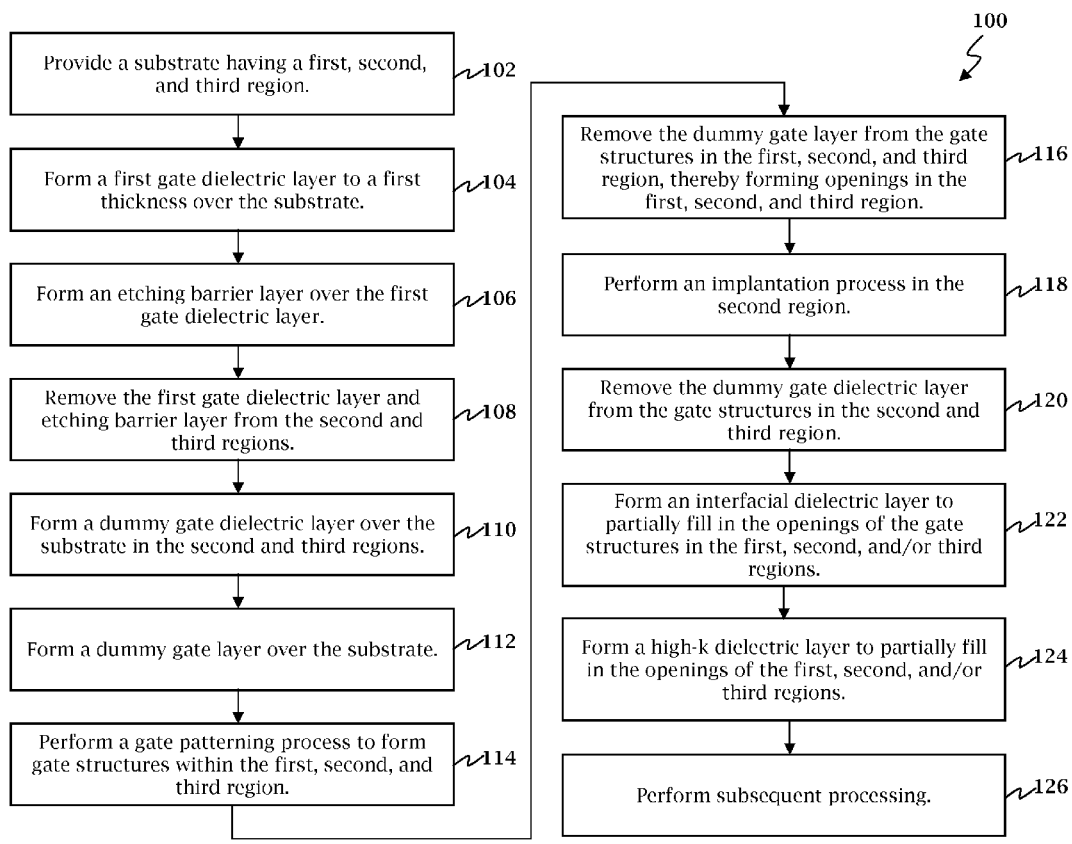
FIG. 1 is a flow chart of a method for fabricating an integrated circuit device according to aspects of the present disclosure.

The present disclosure relates generally to methods for manufacturing integrated circuit devices, and more particularly, to methods for manufacturing integrated circuit devices having gate dielectric layers of varying thicknesses.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference to FIGS. 1 and 2A-2K, a method 100 and a semiconductor device 200 are collectively described below. The semiconductor device 200 illustrates an integrated circuit, or portion thereof, that can comprise logic circuits/devices, memory cells/devices (e.g., SRAM), RF devices, input/output (I/O) devices, system-on-chip (SoC) devices, application specific integrated circuit (ASIC) devices, other suitable devices, and/or combinations thereof. The semiconductor device 200 can include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors; other suitable components; and/or combinations thereof. It is understood that additional steps can be provided before, during, and after the method 100, and some of the steps described below can be replaced or eliminated for additional embodiments of the method. It is further understood that additional features can be added in the semiconductor device 200, and some of the features described below can be replaced or eliminated for additional embodiments of the semiconductor device 200.

FIG. 1 is a flow chart of an exemplary method 100 for fabricating the semiconductor device 200. FIGS. 2A-2K are various exemplary cross-sectional views of the semiconductor device 200, in portion or entirety, during various fabrication stages of the method 100. The method 100 can provide the semiconductor device 200 with gate dielectric layers of varying thicknesses. For example, the method 100 may provide semiconductor device 200 with multiple dielectric layers of varying thicknesses and/or materials. This can be advantageous in system-on-a-chip (SoC) technology and/or application-specific integrated circuit (ASIC) technology. It is understood that different embodiments may have different advantages, and that no particular advantage is necessarily required of any embodiment. It is further understood that the semiconductor device 200 may be formed by CMOS technology processing, and thus some processes are not described in detail herein.

Figure 2A:
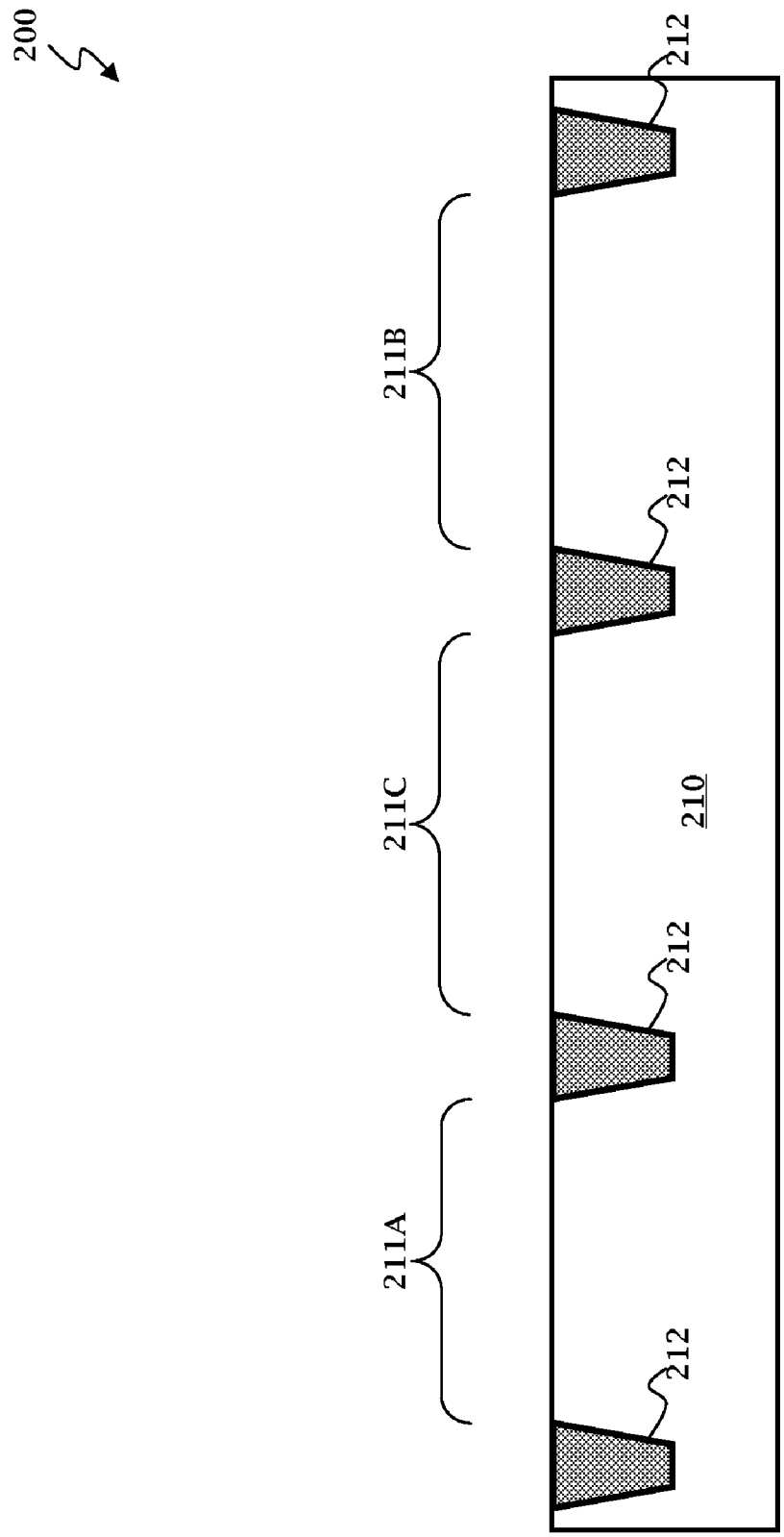
FIGS. 2A-2K are various cross-sectional views of embodiments of an integrated circuit device during various fabrication stages according to the method of FIG. 1.

Referring to FIGS. 1 and 2A, at block 102 of the method 100, a substrate 210 is provided. In the present example, the substrate 210 is a semiconductor substrate comprising silicon. Alternatively, the substrate 210 comprises an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (SOI). In some examples, the semiconductor substrate may include a doped epi layer. In other examples, the silicon substrate may include a multilayer compound semiconductor structure.

The substrate 210 can include various doped regions depending on design requirements as known in the art (e.g., p-type wells or n-type wells). The doped regions are doped with p-type dopants, such as boron or $BF_2$; n-type dopants, such as phosphorus or arsenic; or combinations thereof. The doped regions may be formed directly on the substrate 210, in a P-well structure, in a N-well structure, in a dual-well structure, and/or using a raised structure. The substrate 210 may further include various active regions, such as regions configured for an N-type metal-oxide-semiconductor transistor device (referred to as an NMOS device) and regions configured for a P-type metal-oxide-semiconductor transistor device (referred to as a PMOS device).

The substrate 210 can include an isolation region 212 to isolate various regions of the substrate 210, such as a first, second, and third region as illustrated in FIG. 2A. In the present example, the isolation region 212 isolates a high voltage region 211A (also referred to as an input/output (I/O) region) (first device area), a low voltage region 211B (second device area), and an intermediate core region 211C (third device area) from one another. The isolation region 212 utilizes isolation technology, such as local oxidation of silicon (LOCOS) and/or shallow trench isolation (STI), to define and electrically isolate the various regions. The isolation region 212 comprises silicon oxide, silicon nitride, silicon oxynitride, other suitable materials, or combinations thereof. The isolation region 212 is formed by any suitable process. As one example, the formation of an STI includes a photolithography process, etching a trench in the substrate (for example, by using a dry etching and/or wet etching), and filling the trench (for example, by using a chemical vapor deposition process) with one or more dielectric materials. In some examples, the filled trench may have a multi-layer structure such as a thermal oxide liner layer filled with silicon nitride or silicon oxide.

The semiconductor device 200 includes three devices: a first device in the high voltage region (first device area) 211A, a second device in the low voltage region (second device area) 211B, and a third device in the intermediate core region (third device area) 211C. In the present example, the first, second, and third devices include a gate, which includes a gate dielectric layer. Accordingly, the semiconductor device 200 may be referred to as a tri-gate transistor device. The first, second, and third devices have varying gate dielectric layer thicknesses. For example, the first device in the high voltage region 211A includes a gate dielectric layer of a first thickness (an equivalent oxide thickness (EOT)), which is the thickest gate dielectric layer; the second device in the low voltage region 211B includes a gate dielectric layer of a second thickness, which is a medium thickness (a medium EOT) (in between thicknesses of the first and third device's gate dielectric layer thicknesses); and the third device in the intermediate core region 211C includes a gate dielectric layer of a third thickness, which is the thinnest gate dielectric layer (a thinnest EOT). The present disclosure can provide a process for effectively achieving gate dielectric layers of varying thicknesses (i.e., first, second, and third thicknesses) and/or materials. The gate dielectric layers of varying thicknesses may also be achieved without gate oxide thickness and/or device reliability issues. The device regions described in the present example are simply illustrative and the semiconductor device 200 can comprise any combination and/or variety of device regions. Similarly, the thicknesses in the regions may vary from the exemplary thicknesses described herein.

Figure 2B:
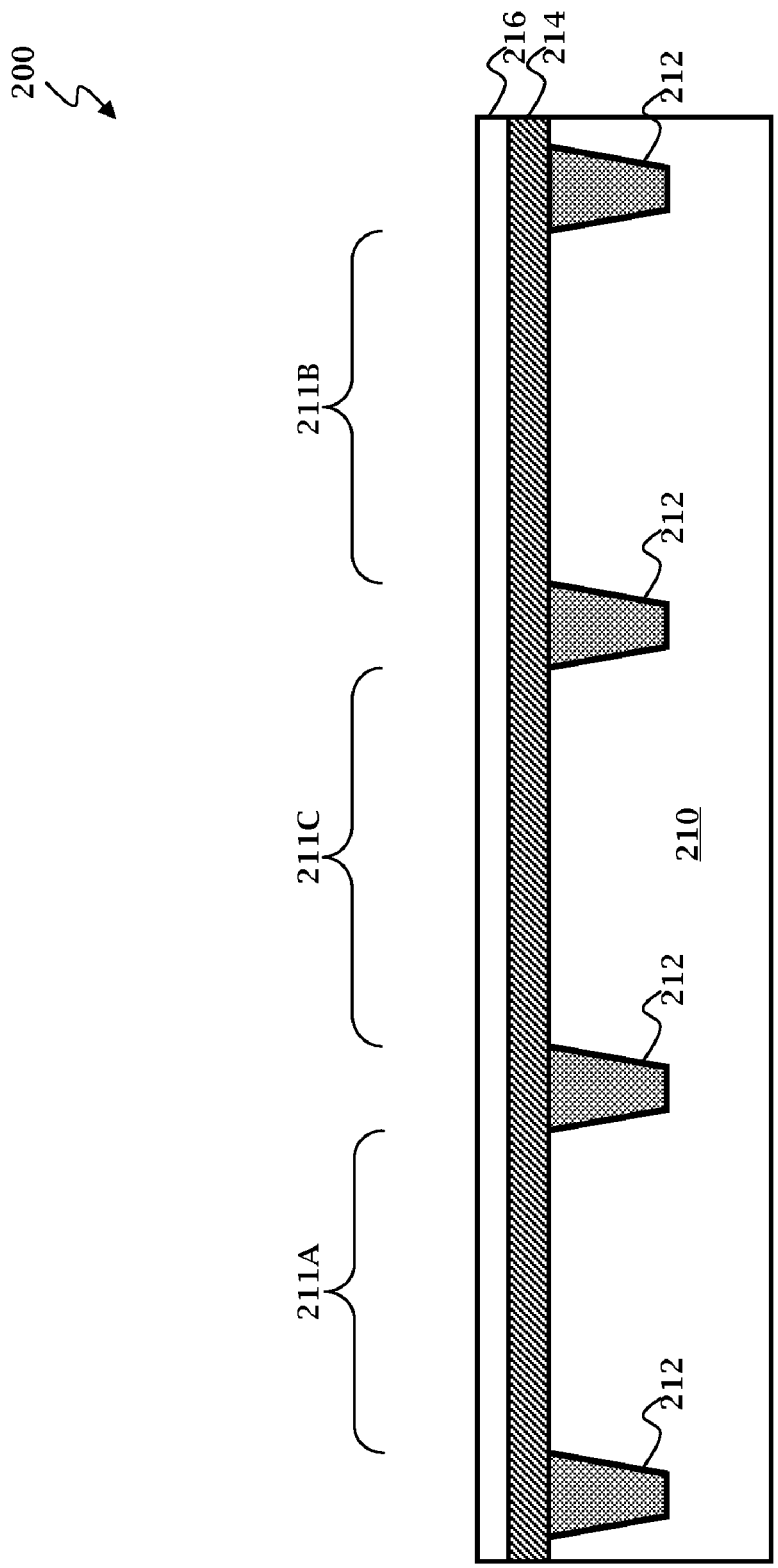

Referring to FIG. 2B, at block 104, a gate dielectric layer 214 is formed over the substrate 210 to a first thickness. The gate dielectric layer 214 (first gate dielectric layer) can be the gate dielectric layer for the first device area (or high voltage region). The gate dielectric layer for the first (high voltage) device is typically the thickest gate dielectric layer present in semiconductor device 200. Thus, the gate dielectric layer 214 is formed to a thickness that meets design specifications of an intended device, where the gate dielectric thickness is sufficient to withstand operating voltages of high voltage devices (e.g., high voltage transistors).

In the present example, the gate dielectric layer 214 comprises an oxide material, such as silicon dioxide. Alternatively, the gate dielectric layer 214 comprises any suitable dielectric material, such as silicon nitride, silicon oxynitride, other suitable dielectric materials, and/or combinations thereof. The gate dielectric layer 214 is formed by any suitable process including chemical vapor deposition (CVD), atomic layer deposition (ALD), plasma enhanced CVD (PECVD), plasma enhanced ALD (PEALD), other suitable processes, and/or combinations thereof. Also, the gate dielectric layer 214 may be thermally grown, such as by a thermal oxidation process.

At block 106, an etching barrier layer 216 is formed over the gate dielectric layer 214 to any suitable thickness. The etching barrier layer 216 can comprise a nitride material. For example, the nitride material is a silicon nitride (SiN) layer and/or a nitridation layer. The etching barrier layer 216 comprising a SiN layer is formed by any suitable process, such as chemical vapor deposition (CVD), atomic layer deposition (ALD), plasma enhanced CVD (PECVD), plasma enhanced ALD (PEALD), other suitable processes, and/or combinations thereof. The etching barrier layer 216 comprising a nitridation layer is formed by any suitable process. In an example, the nitridation layer is formed by a thermal nitridation using an ammonia gas ($NH_3$). In another example, the nitridation layer is formed by a plasma nitridation process. In yet another example, the nitridation layer is formed by an in-situ doping process. As will be discussed in more detail below, the etching barrier layer 216 can protect the gate dielectric layer 214 (i.e., first gate dielectric layer of the first device having a first thickness) from subsequent processing, such as a dummy gate removal process. The etching barrier layer 216 can also or alternatively prevent damage to the oxide material of the first gate dielectric layer 214.

Figure 2C:
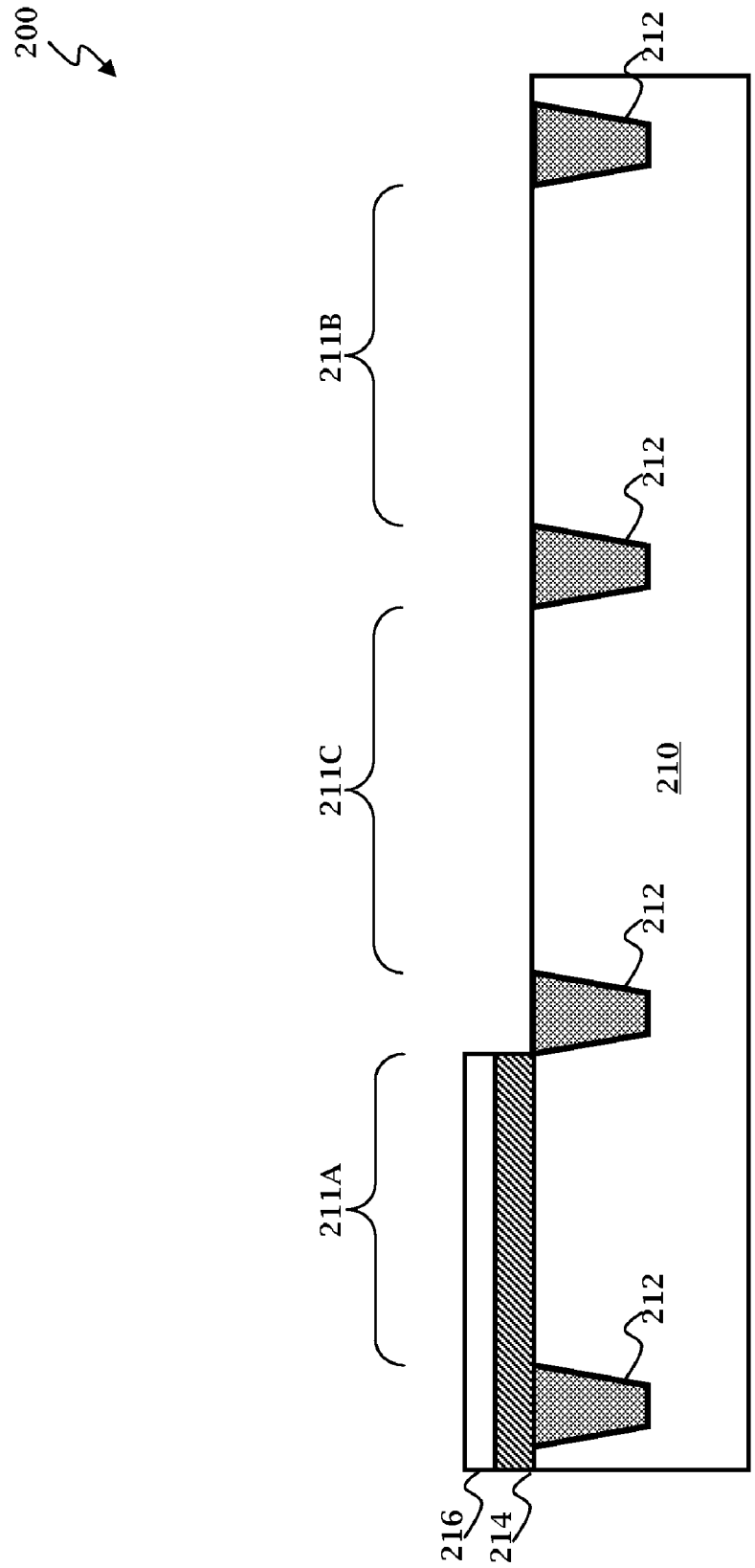
Figure 2D:
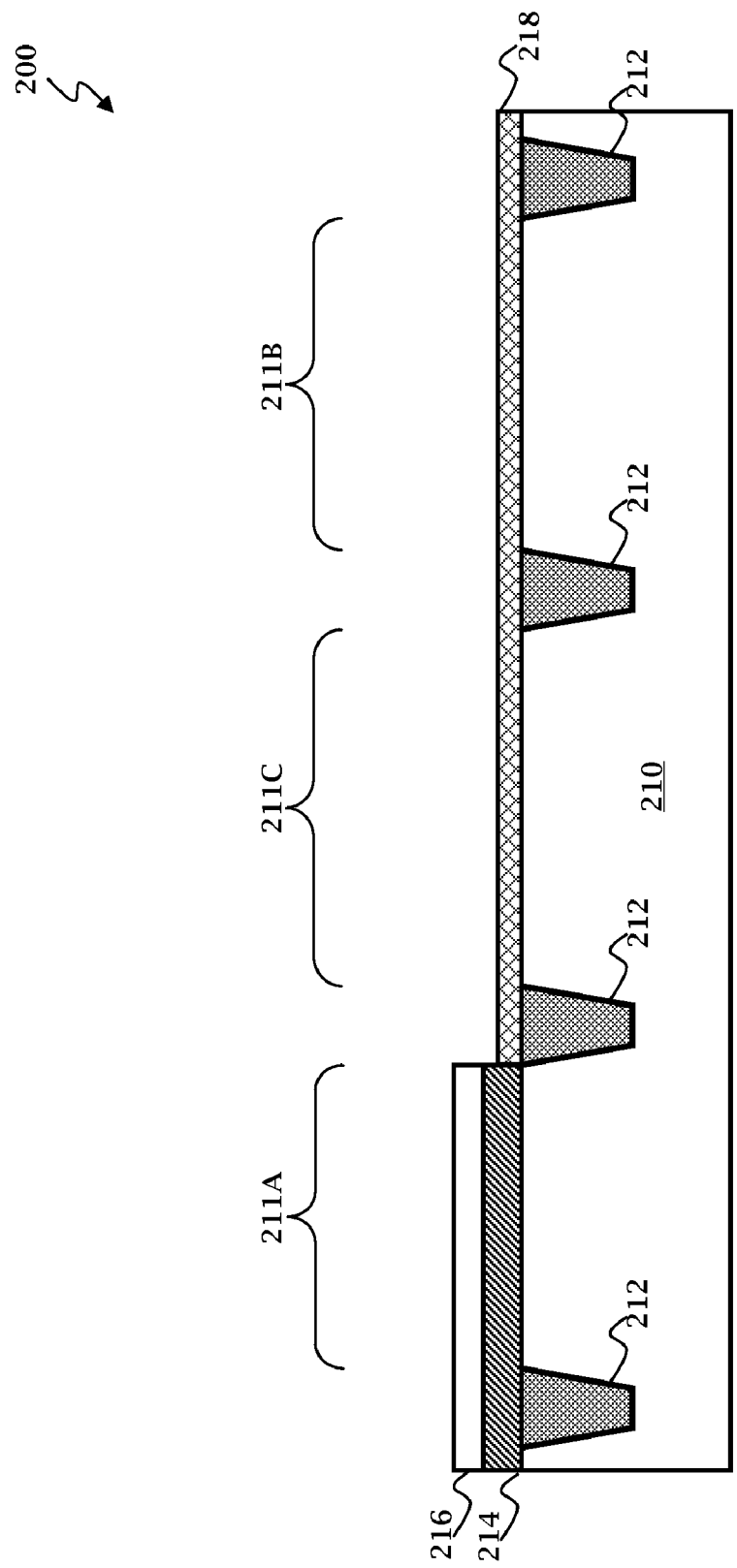

At block 108, the gate dielectric layer 214 and etching barrier layer 216 is removed from the second (low voltage region) and third (intermediate core region) device areas 211B, 211C as illustrated in FIG. 2C. The gate dielectric layer 214 and etching barrier layer 216 is removed from the desired areas by any suitable process, including patterning and etching processes. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. Alternatively, the photolithography exposing process is implemented or replaced by other proper methods such as maskless photolithography, electron-beam writing, and/or ion-beam writing. The etching processes include dry etching, wet etching, and/or other etching methods. In an example, a photoresist layer is formed over the etching barrier layer 216 by a suitable process, such as spin-on coating, and patterned to form a patterned photoresist feature. The pattern of the photoresist can then be transferred by a dry etching process to the underlying layers (i.e., the etching barrier layer 216 and gate dielectric layer 214) to provide exposed and unexposed portions of the etching barrier layer 216. For example, the unexposed portions of the etching barrier layer 216 may be over the first device area 211A, and the exposed portions of the etching barrier layer 216 may be over the second and third device areas 211B, 211C. Then, the exposed etching barrier layer 216 and gate dielectric layer 214 underlying the exposed etching barrier layer 216 are removed by a suitable process, thus removing the gate dielectric and etching barrier layers 214, 216 from the second and third device areas 211B, 211C. The remaining photoresist layer, here in the first device area 211A, may be stripped thereafter.

At block 110, a dummy gate dielectric layer 218 is formed over the substrate 210. Particularly, referring to FIG. 2D, in the present example, the dummy gate dielectric layer 218 is formed over the second and third device areas 211B, 211C. The dummy gate dielectric layer 218 comprises any suitable material. For example, the dummy gate dielectric layer 218 comprises an oxide material. The dummy gate dielectric layer 218 is formed by any suitable process including thermal oxidation, chemical vapor deposition (CVD), atomic layer deposition (ALD), plasma enhanced CVD (PECVD), plasma enhanced ALD (PEALD), other suitable processes, and/or combinations thereof. During dummy gate dielectric layer 218 formation, the etching barrier layer 216 can prevent any impact on the thickness of the gate dielectric layer 214 for the first device in the first device area 211A, ensuring that gate dielectric layer 214 sustains its thickness (e.g., first thickness).

Figure 2E:
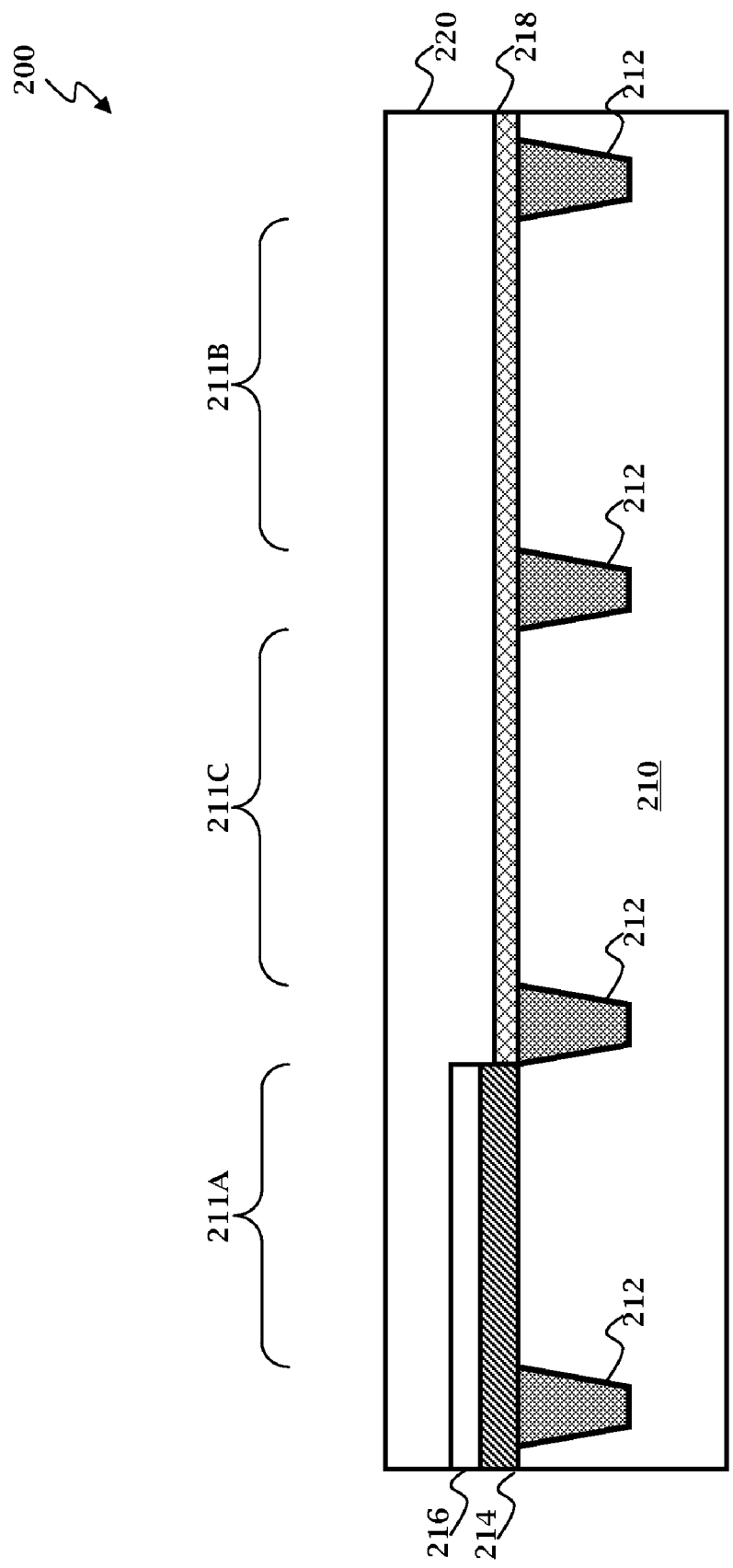

At block 112, a dummy gate layer 220 is formed over the substrate 210. The dummy gate layer 220 can also be referred to as a dummy gate electrode. Referring to FIG. 2E, the dummy gate layer 220 can be deposited over the gate dielectric layer 214, etching barrier layer 216, and dummy gate dielectric layer 218 by a physical vapor deposition (PVD) or chemical vapor deposition (CVD) process. Other deposition processes are contemplated. In the present example, the dummy gate layer 220 comprises polysilicon or amorphous silicon. The dummy gate layer 220 may comprise other suitable materials.

Figure 2F:
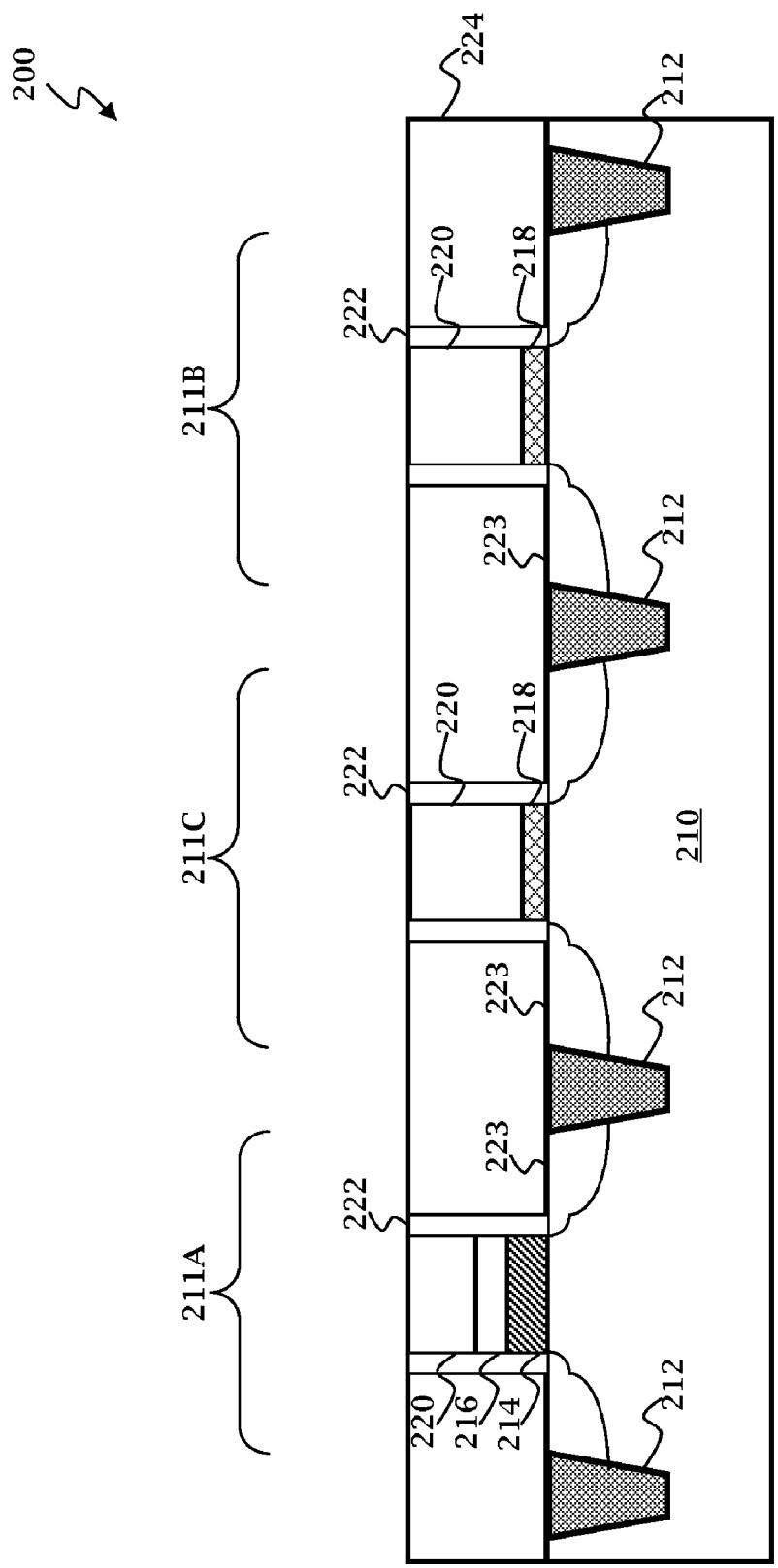

At block 114, a gate patterning process is performed to form gate structures within one or more of the device areas 211A, 211B, 211C. For example, as illustrated in FIG. 2F, a gate structure is formed within each device area 211A, 211B, 211C by suitable processes, such as patterning and etching processes. Each gate structure includes a gate stack having the gate dielectric layer 214, etching barrier layer 216, dummy gate dielectric layer 218, and/or dummy gate layer 220. In the present embodiment, a first gate structure including a first gate stack having gate dielectric, etching barrier, and dummy gate layers 214, 216, 220 is formed in the first device area 211A over the substrate 210; a second gate structure including a second gate stack having dummy gate dielectric and dummy gate layers 218, 220 is formed in the second device area 211B over the substrate 210; and a third gate structure including a third gate stack having dummy gate dielectric and dummy gate layers 218, 220 is formed in the third device area 211C over the substrate 210. It is understood that the gate stacks may comprise additional layers.

In an example, a layer of photoresist is formed over the dummy gate layer 220 by a suitable process, such as spin-on coating, and patterned to form a patterned photoresist feature. The pattern of the photoresist can then be transferred by a dry etching process to the underlying layers (i.e., the gate dielectric, etching barrier, dummy gate dielectric, and dummy gate layers 214, 216, 218, 220) to form the gate stacks of each gate structure in device regions/areas 211A, 211B, 211C. The photoresist layer may be stripped thereafter. In another example, a hard mask layer is formed over the dummy gate layer; a patterned photoresist layer is formed on the hard mask layer; the pattern of the photoresist layer is transferred to the hard mask layer and then transferred to the dummy gate layer (and underlying layers) to form the gate stacks of the gate structures. It is understood that the above examples do not limit the processing steps that may be utilized to form the gate stack.

The gate structures can further include spacers 222 formed on the sidewalls of the gate stacks by any suitable process to any suitable thickness. The gate spacers 222 are positioned on each side of the gate stacks. The gate spacers 222 comprise any suitable material. In various examples, the gate spacers 222 comprise a dielectric material, such as silicon nitride, silicon carbide, silicon oxynitride, other suitable materials, and/or combinations thereof. The gate spacers 222 may be used to offset subsequently formed doped regions, such as heavily doped source/drain regions. Forming the spacers 222 may further include forming other features, such as a sealing layer and/or spacer liner.

Various doped regions 223 may also be formed in the substrate 210. For example, various doped regions 223 comprise lightly doped source/drain (LDD) regions and/or source/drain (S/D) regions (also referred to as heavily doped S/D regions). The LDD regions and S/D regions can be formed by one or more ion implantation processes, photolithography processes, diffusion processes, and/or other suitable processes. The doping species depend on the type of device being fabricated, such as an NMOS or PMOS device, and include p-type dopants, such as boron or $BF_2$; n-type dopants, such as phosphorus or arsenic; and/or combinations thereof. The LDD and S/D regions may comprise various doping profiles. The LDD regions may be formed prior to formation of the spacers 222, and the S/D regions may be aligned with an outer edge of the spacers 222 following one or more implantation processes. Additionally, one or more annealing processes can be performed to activate the LDD and/or S/D regions. The annealing processes include rapid thermal annealing (RTA) and/or laser annealing processes. In some examples, the S/D regions may include raised S/D regions, which can be formed by one or more epitaxy processes, such that SiGe and/or Si features can be formed in a crystalline state in the substrate 210. Other material features are contemplated. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy processes may use gaseous and/or liquid precursors, which interact with the composition of the substrate 210 (e.g., silicon).

One or more contact features, such as silicide regions, may also be formed. The contact features can be coupled to the S/D regions. The contact features comprise silicide materials such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable materials, and/or combinations thereof. The contact features are formed by any suitable process, such as a salicide (self-aligned silicide) process. For example, a metal material may be deposited over the substrate, including over the substrate (e.g., silicon regions) and/or doped regions. After deposition, the salicidation process may continue with a reaction between the deposited metal material and the silicon regions at an elevated temperature that is selected based on the specific metal material or materials. The unreacted metal material is removed thereafter. The reacted silicide may require additional thermal process to reduce the resistance of the silicide.

An interlayer (or inter-level) dielectric (ILD) layer 224 may also be formed over the substrate 210. The ILD layer 224 comprises any suitable dielectric material including silicon oxide, silicon nitride, silicon oxynitride, tetraethylorthosilicate (TEOS) formed oxide, other suitable dielectric materials, and/or combinations thereof. Alternatively, the ILD layer 224 comprises a low-k dielectric material, such as fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other proper materials, and/or combinations thereof. The ILD layer 224 may include an oxide formed by a high aspect ratio process (HARP) and/or high density plasma (HDP) deposition process. The ILD layer 224 is formed by other suitable processes including CVD, high density plasma CVD, sputtering, and/or other suitable methods. The ILD layer 224 may further include a multilayer structure comprising multiple dielectric materials. Additional layers may also be formed overlying and/or underlying the ILD layer 224. One or more chemical mechanical polishing (CMP) processes may be performed to planarize the ILD layer 224. For example, a CMP process can be performed until the dummy gate layer 220 of the first, second, and third devices is exposed as illustrated in FIG. 2F.

Figure 2G:
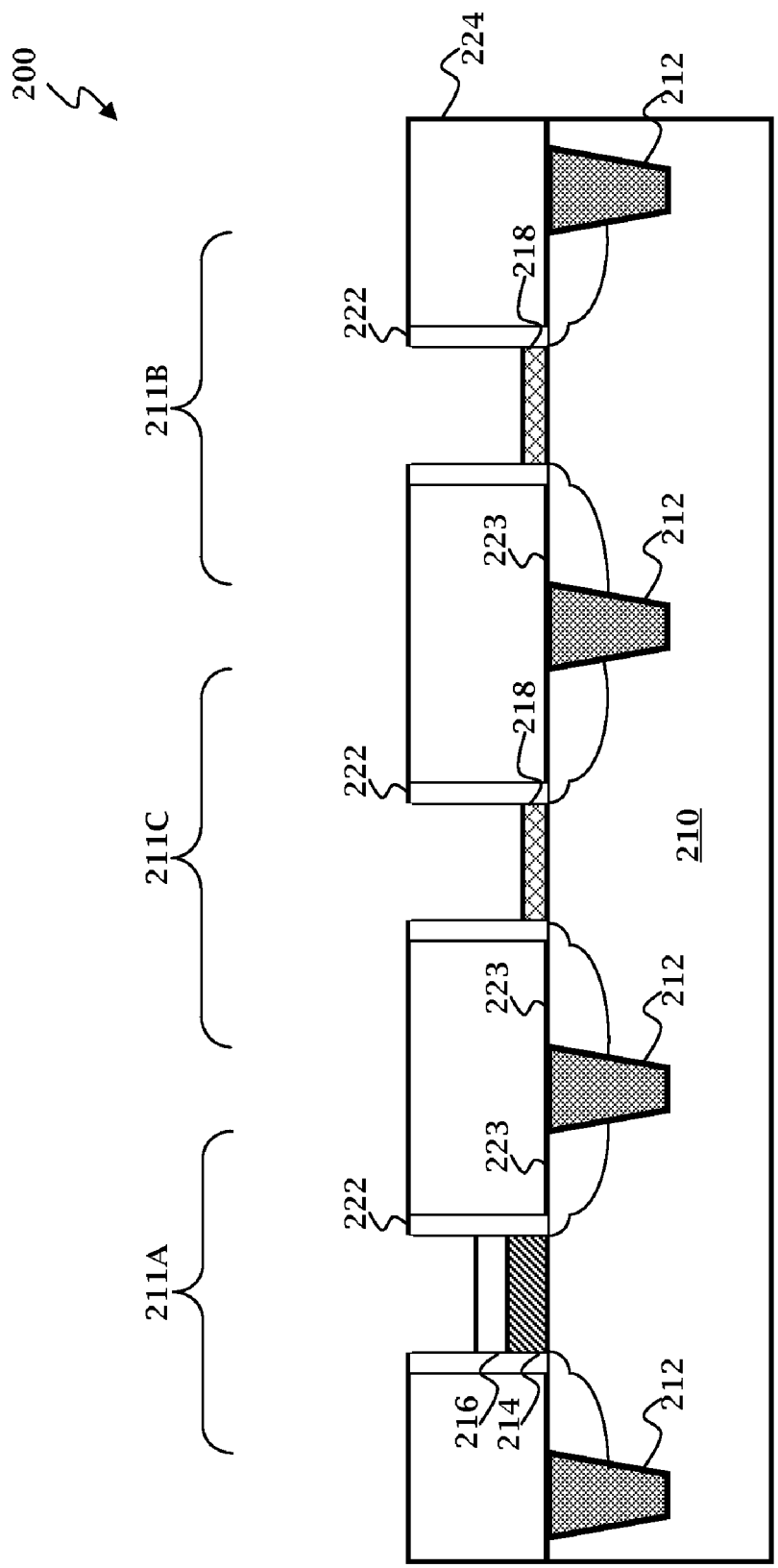

Referring to FIGS. 1 and 2G, at block 116, the dummy gate layer 220 is removed from the gate structures in the first, second, and third device areas 211A, 211B, 211C, thereby forming openings (or trenches) in the gate structures. The dummy gate layer is removed by any suitable process. For example, removing dummy gate layer 220 includes one or more etching processes, including wet etching processes, dry etching processes, and/or combinations thereof. In the present example, the dummy gate layer 220 can be removed by a wet etching process that utilizes a $NH_4OH$ and/or DHF (diluted hydrofluoric acid) solution.

Figure 2H:
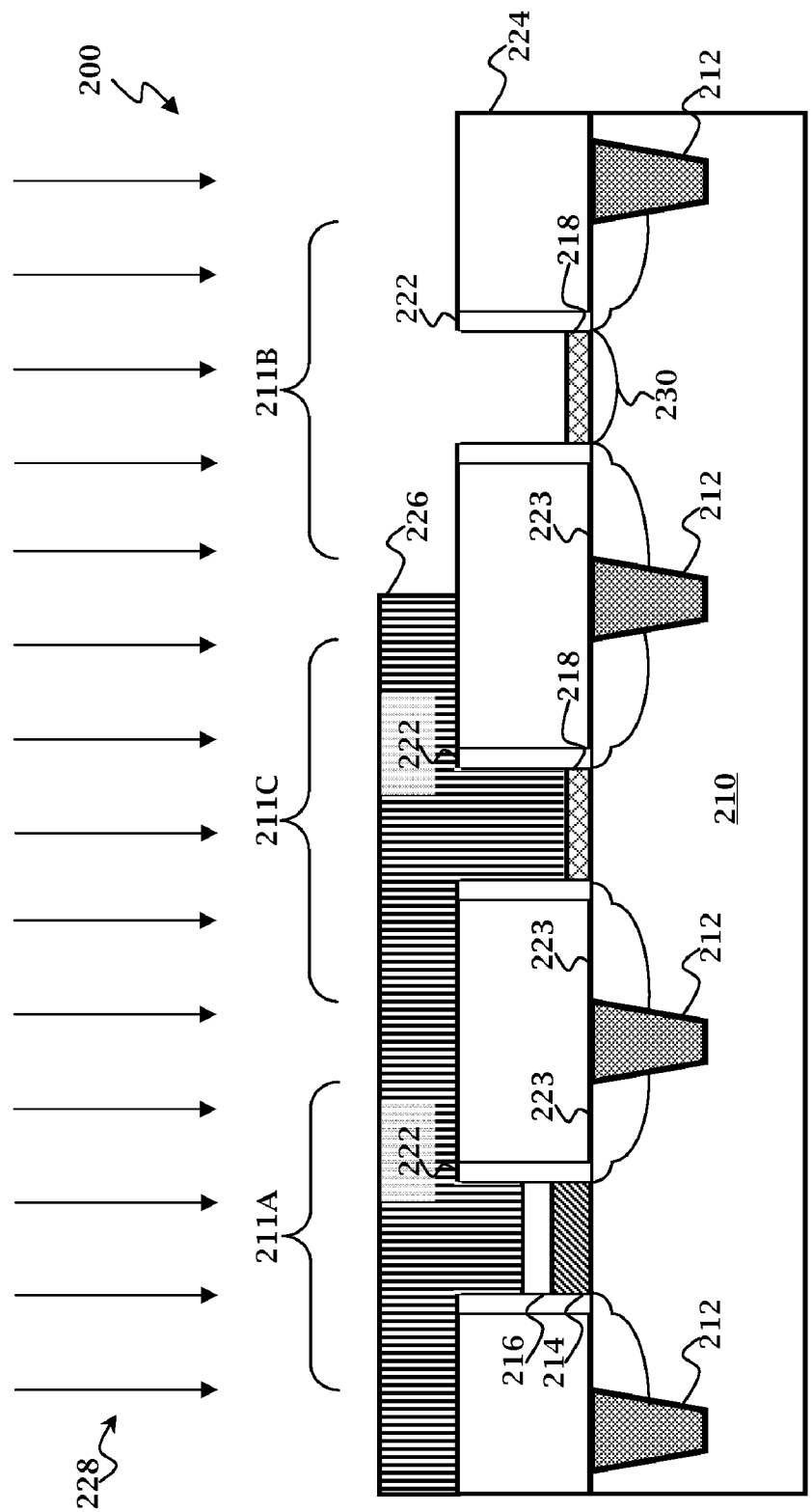

At block 118, an implantation process is performed on the second device area 211B. More particularly, a patterned layer 226 is formed to any suitable thickness by photolithography and patterning processes to overlay (or protect) a region of the substrate. Referring to FIG. 2H, the patterned layer 226 is formed over the first and third device areas 211A, 211C, and protects the first (high voltage) device and third (intermediate core) device regions 211A, 211C while the second (low voltage) device region 211B is exposed to the implantation process. The patterned layer 226 comprises a photoresist layer and/or hard mask layer. The photoresist layer comprises any suitable material and includes a positive-type or negative-type resist material. An exemplary photoresist layer includes a chemical amplifying (CA) resist layer. The hard mask layer comprises any suitable material, such as silicon nitride, SiON, SiC, SiOC, spin-on glass (SOG), and/or other suitable material.

When the second (low voltage) device region 211B is exposed to an implantation process 228, dopants are implanted through the surface of the substrate 210 within the opening (trench) of the gate structure of the second device, which may form an implant region 230. The implantation process 228 utilizes any suitable doping species, and in the present example, utilizes indium (In), argon (Ar), silicon (Si), and/or fluorine (F) doping species. The implantation process 228 includes any suitable implantation dose and/or energy. The implantation process 228 can be used to increase an oxidation rate, which provides for varied layer growth in later processing. By increasing the oxidation rate, the implantation process can effect the thicknesses of the gate dielectric layers that will be formed for the second and third devices in the second and third device regions 211B, 211C. In the present embodiment, the implantation process 228 increases the oxidation rate, such that when gate dielectric layers are grown in the second and third device regions 211B, 211C, the thickness of the gate dielectric layer of the second device area (i.e., second thickness) is greater than the thickness of the gate dielectric layer of the third device area (i.e., third thickness). The varying thickness can result from the increased oxidation rate in the second device region 211B caused by the implantation process 228. The patterned layer 226 may be subsequently removed.

Figure 2I:
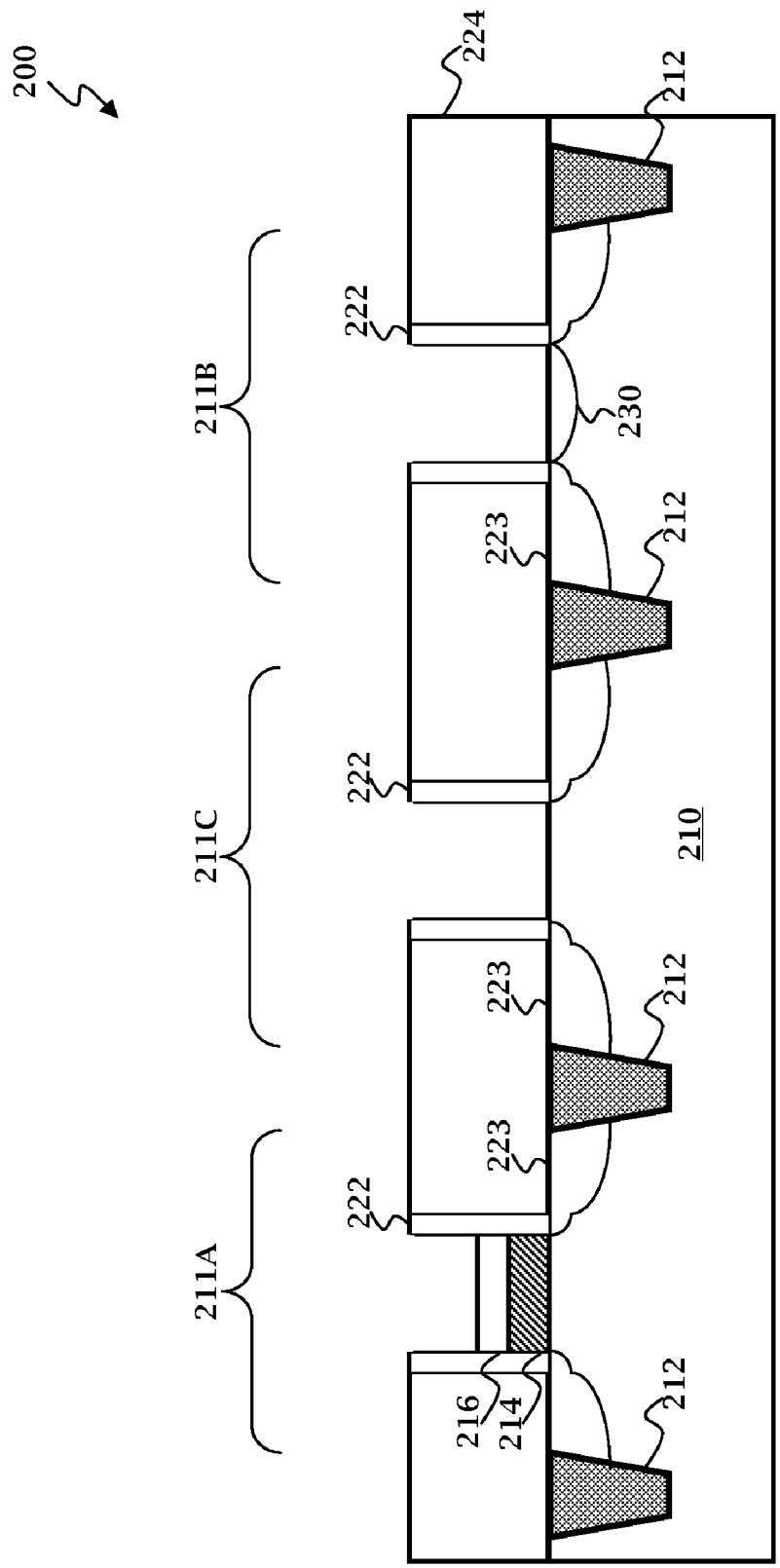

At block 120, the dummy gate dielectric layer 218 is removed from within the openings (trenches) of the gate structures of the second and third regions 211B, 211C as illustrated in FIG. 2I. The dummy gate dielectric layer 218 is removed by any suitable process, such as various etching processes. For example, a vapor process and/or a wet etching process implementing a DHF solution may remove the dummy gate dielectric layer 218. During this removal process, the etching barrier layer 216 can protect the gate dielectric layer 214 (i.e., first gate dielectric layer of the first device having the first thickness) because forming the etching barrier layer 216 increases the etching selectivity between the dummy gate dielectric layer 218 and gate dielectric layer 214/etching barrier layer 216. Thus, the etching process can selectively etch away the dummy gate dielectric layer 218, etching the dummy gate dielectric layer 218 (e.g., oxide material) at a rate greater than the etching barrier layer 216 (e.g., nitride material). For example, the etching selectivity of nitride/oxide can be greater than three (3). The etching process may remove partially or completely the etching barrier layer 216.

At block 122, an interfacial layer 232 is formed in the openings (trenches) of the gate structures of the semiconductor device 200. The interfacial layer 232 is formed by any suitable process to any suitable thickness. For example, the interfacial layer 232 includes a grown silicon oxide layer (e.g., thermal oxide or chemical oxide). The interfacial layer 232 may be a native oxide layer. In another example, the interfacial layer 232 is an oxide layer deposited by an ALD or CVD process. Alternatively, the interfacial layer 232 comprise a layer including other suitable dielectric materials, such as silicon oxynitride (SiON).

Figure 2J:
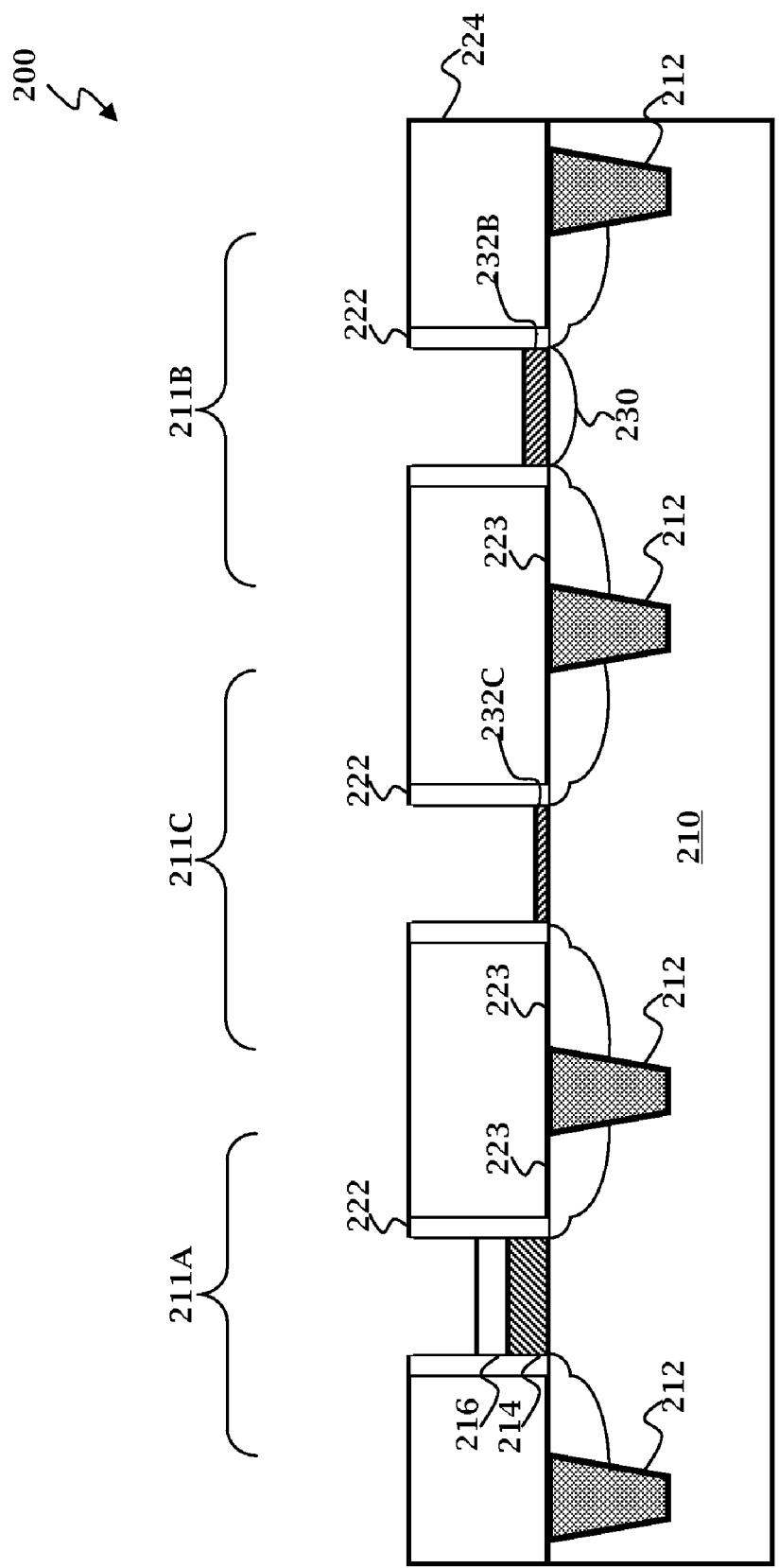

The interfacial layer 232 can be formed in the gate structures of the second and third device regions 211B, 211C, which serves as the gate dielectric layers of the second and third devices. The interfacial layer 232 partially fills in the openings (or trenches) of the gate structures in the second and third regions 211B, 211C. As illustrated in FIG. 2J, the thicknesses of the interfacial layer 232 vary—the interfacial layer 232B in the second device region 211B comprises a second thickness (also referred to as a second gate dielectric layer 232B) and the interfacial layer 232C in the third device region 211C comprises a third thickness (also referred to as a third gate dielectric layer 232C). As noted herein, the thickness of the gate dielectric layer of the third device in the third device region 211C is the thinnest dielectric layer, and thus, the thickness of the interfacial layer 232B is greater than the thickness of the interfacial layer 232C. The varying thicknesses of the interfacial layer 232 can arise because of the implantation process increasing the oxidation rate, which produces different channel oxidation enhancement conditions.

In the present embodiment, a portion of the etching barrier layer 216 remains in the gate structure of the first device of the first device area 211A. The remaining etching barrier layer 216 can act as an interfacial layer for the gate stack in the first device of the first device area 211A. Because the etching barrier layer 216 can prevent impact on the gate dielectric layer 214, the gate dielectric layer of the first device area 211A can maintain its thickness throughout processing, and thus, the gate dielectric layer 214 having the first thickness in the first device area 211A comprises the thickest gate dielectric layer.

Figure 2K:
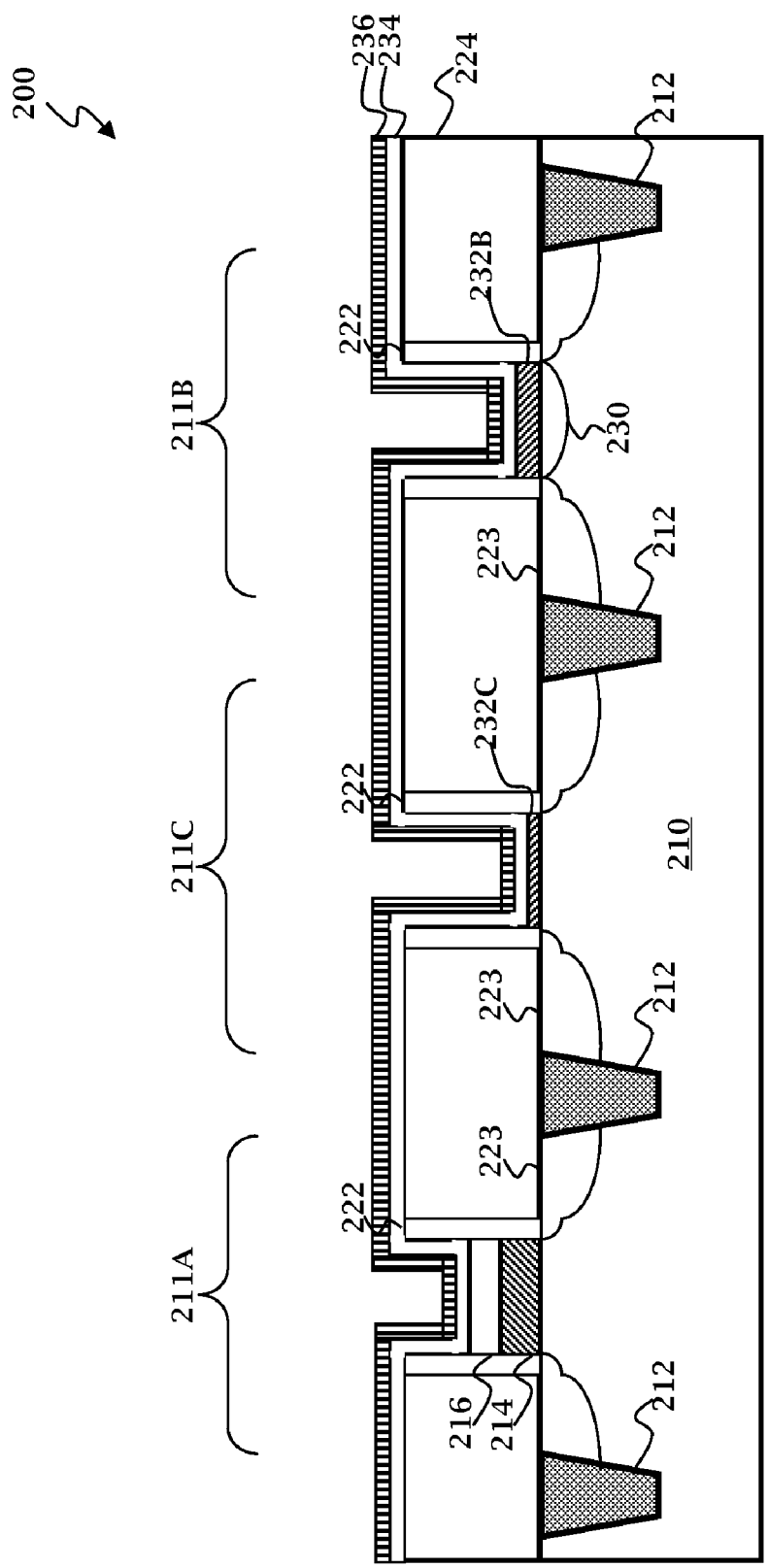

At block 124, as illustrated in FIG. 2K, a high-k dielectric layer 234 can be formed in the openings (trenches) of the gate structures of the semiconductor device 200. The high-k dielectric layer 234 partially fill in the openings (or trenches) of the gate structures in the first, second, and third regions 211A, 211B, 211C. A barrier (or capping) layer 236 may also be formed over the high-k dielectric layer 234. The high-k dielectric layer 234 and barrier layer 236 is formed by any suitable process to any suitable thickness. The high-k dielectric layer 234 comprises a high-k dielectric material, such as HfO$_2$, HfSiO, HfSiON, HfTaO, HfTiO, HfZrO, LaO, AlO, ZrO, TiO, Ta$_2$O$_5$, Y$_2$O$_3$, SrTiO$_3$ (STO), BaTiO$_3$ (BTO), BaZrO, HfLaO, HfSiO, LaSiO, AlSiO, (Ba, Sr)TiO$_3$ (BST), Al$_2$O$_3$, Si$_3$N$_4$, oxynitrides, other suitable high-k dielectric materials, and/or combinations thereof. The barrier layer 236 comprises a suitable material, such as titanium, titanium nitride, tantalum, tantalum nitride, other suitable materials, and/or combinations thereof.

At block 126, subsequent processing may be performed. For example, a metal gate can be formed in the first, second, and third devices of the first, second, and third device areas 211A, 211B, 211C. The metal gate may fill the openings of the gate structures in the first, second, and third regions 211A, 211B, 211C. The metal gate is formed by any suitable process to any suitable thickness. For example, an atomic layer deposition (ALD) or physical vapor deposition (PVD) process may be used to form the metal gate. Subsequently, one or more CMP processes may be performed to planarize the layers used to form the metal gate and high-k dielectric layer 234 (and/or barrier layer 236). It is understood that n-metal and p-metal structures may be formed. Thus, during the formation of the metal gate structures, N/P patterning may be implemented to separate one type of device from the other, and vice versa. The metal gates may further comprise liner layers, work function layers, fill layers, other suitable layers, and/or combinations thereof.

The metal gate of each device may comprise the same or different materials and/or thicknesses. The metal gate may comprise a work function material and an additional conductive layer. The work function layer and conductive layer includes any suitable material, such as aluminum, copper, tungsten, titanium, tantulum, titanium nitride, tantalum nitride, nickel silicide, cobalt silicide, silver, TaC, TaSiN, TaCN, TiAl, TiAlN, WN, metal alloys, polysilicon, other suitable materials, and/or combinations thereof. Exemplary work function layers for an NMOS device include tantalum nitride, titanium aluminum, titanium aluminum nitride, or combinations thereof; and exemplary work function layers for a PMOS device may include tungsten, titanium nitride, tungsten nitride, or combinations thereof.

The semiconductor device 200 may undergo further CMOS or MOS technology processing to form various features known in the art. Subsequent processing may form various contacts/vias/lines and multilayer interconnect features (e.g., metal layers and interlayer dielectrics) on the substrate 210, configured to connect the various features or structures of the semiconductor device 200. The additional features may provide electrical interconnection to the device including the formed metal gate structures. For example, a multilayer interconnection includes vertical interconnects, such as conventional vias or contacts, and horizontal interconnects, such as metal lines. The various interconnection features may implement various conductive materials including copper, tungsten, and/or silicide. In one example a damascene and/or dual damascene process is used to form a copper related multilayer interconnection structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a first gate structure and a second gate structure over a substrate, the first gate structure including a first gate dielectric layer and the second gate structure including a second gate dielectric layer, wherein the forming the first gate structure and the second gate structure includes a gate replacement process where a dummy gate of the first gate structure and the second gate structure is replaced with a metal gate, and during the gate replacement process:
after removing the dummy gate of the first gate structure and the second gate structure, implanting a portion of the substrate to increase an oxidation rate of the portion of the substrate, wherein a dummy gate dielectric layer is disposed over the portion of the substrate; and
after removing the dummy gate dielectric layer, simultaneously forming the first gate dielectric layer and the second gate dielectric layer over the substrate, wherein the second gate dielectric layer is formed over the implanted portion of the substrate and the first gate dielectric layer is formed over a non-implanted portion of the substrate, wherein the first gate dielectric layer has a first thickness and the second gate dielectric layer has a second thickness that is greater than the first thickness.

2. The method of claim 1 wherein the implanting the portion of the substrate to increase the oxidation rate of the portion of the substrate includes implanting one of indium (In), argon (Ar), silicon (Si), fluorine (F), and combinations thereof.

3. The method of claim 1 wherein the simultaneously forming the first gate dielectric layer and the second gate dielectric layer includes growing an oxide-containing layer over the substrate.

4. The method of claim 3 wherein the growing the oxide-containing layer over the substrate includes forming one of a thermal silicon oxide layer and a chemical silicon oxide layer.

5. The method of claim 1 wherein the forming the first gate structure and the second gate structure further includes:
forming a high-k dielectric layer over the first gate dielectric layer and the second gate dielectric layer; and
forming the metal gate over the high-k dielectric layer.

6. The method of claim 1 further including forming a third gate structure over the substrate, the third gate structure including a third gate dielectric layer with a third thickness that is greater than the second thickness.

7. The method of claim 6 wherein the forming the third gate structure includes forming the third gate dielectric layer over the substrate before simultaneously forming the first gate dielectric layer and the second gate dielectric layer.

8. The method of claim 6 wherein the forming the third gate structure includes forming an etching barrier layer over the third gate dielectric layer.

9. The method of claim 8 wherein the forming the etching barrier layer includes forming a nitride layer.

10. A method comprising:
forming a dummy gate dielectric layer over a semiconductor substrate;
forming a dummy gate layer over the dummy gate dielectric layer;
patterning the dummy gate dielectric layer and the dummy gate layer to form a first gate stack and a second gate stack over the semiconductor substrate, wherein the first gate stack and the second gate stack include the dummy gate dielectric layer and the dummy gate layer;
forming spacers along sidewalls of the first gate stack and the second gate stack;
removing the dummy gate layer from the first gate stack and the second gate stack, thereby exposing the dummy gate dielectric layer;
implanting the substrate through the dummy gate dielectric layer of the second gate stack;
after implanting, removing the dummy gate dielectric layer, thereby exposing the substrate; and
forming a gate dielectric layer over the exposed substrate and a gate layer over the gate dielectric layer, such that the first gate stack and the second gate stack include the gate dielectric layer and the gate layer, wherein the gate dielectric layer in the first gate stack has a thickness less than the gate dielectric layer in the second gate stack.

11. The method of claim 10 wherein the implanting the substrate through the dummy gate dielectric layer of the second gate stack includes increasing an oxidation rate of the substrate.

12. The method of claim 10 wherein the implanting the substrate through the dummy gate dielectric layer of the second gate stack includes implanting one of indium (In), argon (Ar), silicon (Si), fluorine (F), and combinations thereof.

13. The method of claim 10 wherein the implanting the substrate includes forming a resist layer over the dummy gate dielectric layer of the first gate stack.

14. The method of claim 10 further including:
forming the dummy gate layer over a barrier layer, wherein another gate dielectric layer having a thickness greater than the gate dielectric layer in the first gate stack and the second gate stack is disposed between the barrier layer and the semiconductor substrate;
patterning the another gate dielectric layer, the barrier layer, and the dummy gate layer to form a third gate stack over the semiconductor substrate, wherein the third gate stack includes the another gate dielectric layer, the barrier layer, and the dummy gate layer; and
forming spacers along sidewalls of the third gate stack.

15. The method of claim 14 further including:
removing the dummy gate layer of the third gate stack while simultaneously removing the dummy gate layer from the first gate stack and the second gate stack;
forming a resist layer over the dummy gate dielectric layer of the first gate stack and the barrier layer of the third gate stack; and
after implanting the substrate, removing the resist layer.

16. The method of 15 further including forming the gate layer over the barrier layer, such that the third gate stack includes the another gate dielectric layer, the barrier layer, and the gate layer.

17. The method of claim 10 further including forming a high-k gate dielectric layer between the gate dielectric layer and the gate layer.

18. A method comprising:
forming a first gate structure, a second gate structure, and a third gate structure over a substrate, the first gate structure including a first gate dielectric layer with a first thickness, the second gate structure including a second gate dielectric layer with a second thickness that is greater than the first thickness, and the third gate structure including a third gate dielectric layer with a third thickness that is greater than the second thickness, wherein the forming the first gate structure, the second gate structure, and the third gate structure includes:
implanting a portion of the substrate over which the second gate dielectric layer is formed, thereby increasing an oxidation rate of the portion of the substrate;
simultaneously forming the first gate dielectric layer and the second gate dielectric layer over the substrate; and
forming a silicon nitride layer over the third dielectric layer, wherein the silicon nitride layer remains over the third dielectric layer during the implanting of the portion of the substrate and the forming of the first gate dielectric layer and the second gate dielectric layer.

19. The method of claim 18 wherein the forming of the first gate dielectric layer and the second gate dielectric layer includes selectively etching a dielectric layer disposed over the substrate wherein the first gate dielectric layer and the second gate dielectric layer are formed.

20. The method of claim 19 wherein the silicon nitride layer acts as an etch stop layer during the selectively etching the dielectric layer.

* * * * *